United States Patent
Duewer (12)

(10) Patent No.: US 7,034,593 B1
(45) Date of Patent: Apr. 25, 2006

(54) RESET MODE INDICATION FOR AN INTEGRATED CIRCUIT USING A NON-DEDICATED PIN

(75) Inventor: Bruce Duewer, Austin, TX (US)

(73) Assignee: Cirrus Logic, Inc., Austin, TX (US)

(*) Notice: Subject to any disclaimer, the term of this patent is extended or adjusted under 35 U.S.C. 154(b) by 106 days.

(21) Appl. No.: 10/713,973

(22) Filed: Nov. 13, 2003

(51) Int. Cl.
 *H03K 3/02* (2006.01)
(52) U.S. Cl. ......................................... 327/198; 714/23
(58) Field of Classification Search ................ 327/198, 327/564, 565; 714/23, 55
 See application file for complete search history.

(56) References Cited

U.S. PATENT DOCUMENTS

| 4,336,495 A | * | 6/1982 | Hapke ........................ 324/765 |
| 4,612,499 A | * | 9/1986 | Andresen et al. ........... 324/73.1 |
| 5,155,730 A | * | 10/1992 | Maida ......................... 714/23 |

* cited by examiner

*Primary Examiner*—Kenneth B. Wells
(74) *Attorney, Agent, or Firm*—Steven Lin, Esq.

(57) ABSTRACT

An integrated circuit has circuitry and pins coupled to the circuitry. One of the pins is a non-dedicated reset pin having a pin signal that is set at a level outside of a normal range for the pin signal so that the integrated circuit is indicated to reset.

18 Claims, 4 Drawing Sheets

FIGURE 1 - PRIOR ART

RESET MODE INDICATION FOR AN INTEGRATED CIRCUIT USING A NON-DEDICATED PIN

BACKGROUND OF THE INVENTION

1. Field of the Invention

The present invention relates to an integrated circuit technique, and, more particularly, to a technique for resetting an integrated circuit. More specifically, the present invention relates to resetting an integrated circuit using a non-dedicated reset pin.

2. Description of Related Art

An integrated circuit is typically provided on a chip having a number of pins. A reset feature generally needs to be provided for the integrated circuit. One easy way to provide such a reset feature is to designate one of the chip pins as a dedicated reset pin. FIG. 1 shows an integrated circuit 100 according to the prior art. Integrated circuit has a number of pins 102, 104, 106, 108, 110, 112, 114, 116, 118, 120 and also a designated reset pin RESET. In one example, the designated reset pin RESET is toggled between a high value, which indicates that the chip is to reset, and a low value, which indicates the chip is to operate in a normal mode.

Lowering the pin count of a chip is generally desirable. For example, a lower pin count helps lower the manufacturing costs of a chip and may make the chip more marketable due to the lower number of pin interfaces. In lowering the pin count of a chip, the designated reset pin is often omitted. When the designated reset pin is omitted to reduce pin count, another way for resetting the chip needs to be provided.

One such alternative way for indicating chip reset is a power-on reset. A power-on reset generally involves the chip detecting whether a power supply voltage level at a power supply pin has exceeded a certain threshold. When the power supply voltage level has exceeded the certain threshold, then the chip has been powered on and the chip needs to be reset. Otherwise, the chip operates in the normal manner. However, the problem with a power-on reset is that the power supply may not have completely turned on or may not have been stable when it turned on. In these situations, the chip may not have reset at the appropriate time when the power-on occurred, which may cause the chip to cease operating or cause other operating errors. For testing of a chip, it is desirable to control the exact time of when the chip leaves reset, and such control is difficult to obtain with a power-on reset.

Thus, the present invention recognizes the desire and need for providing a way for resetting an integrated circuit without the use of a dedicated reset pin. The present invention further recognizes the desire and need to reset an integrated circuit, which avoids using a power-on reset. The present invention also recognizes the desire and need to provide a way for resetting an integrated circuit without adding additional pins. The present invention overcomes the problems and disadvantages in accordance with the prior art.

SUMMARY OF THE INVENTION

An integrated circuit has circuitry and pins coupled to the circuitry. One of the pins is a non-dedicated reset pin having a pin signal that is set at a level outside of a normal range for the pin signal so that the integrated circuit is indicated to reset.

BRIEF DESCRIPTION OF THE DRAWINGS

The novel features believed characteristic of the invention are set forth in the appended claims. The invention itself, however, as well as a preferred mode of use, further objects and advantages thereof, will best be understood by reference to the following detailed description of an illustrative embodiment when read in conjunction with the accompanying drawings, wherein:

DETAILED DESCRIPTION OF THE INVENTION

An integrated circuit has a circuitry and pins coupled to the circuitry. One of the pins is a non-dedicated reset pin having a pin signal that is set at a level outside of a normal range for the pin signal so that the integrated circuit is indicated to reset.

Figure 1:
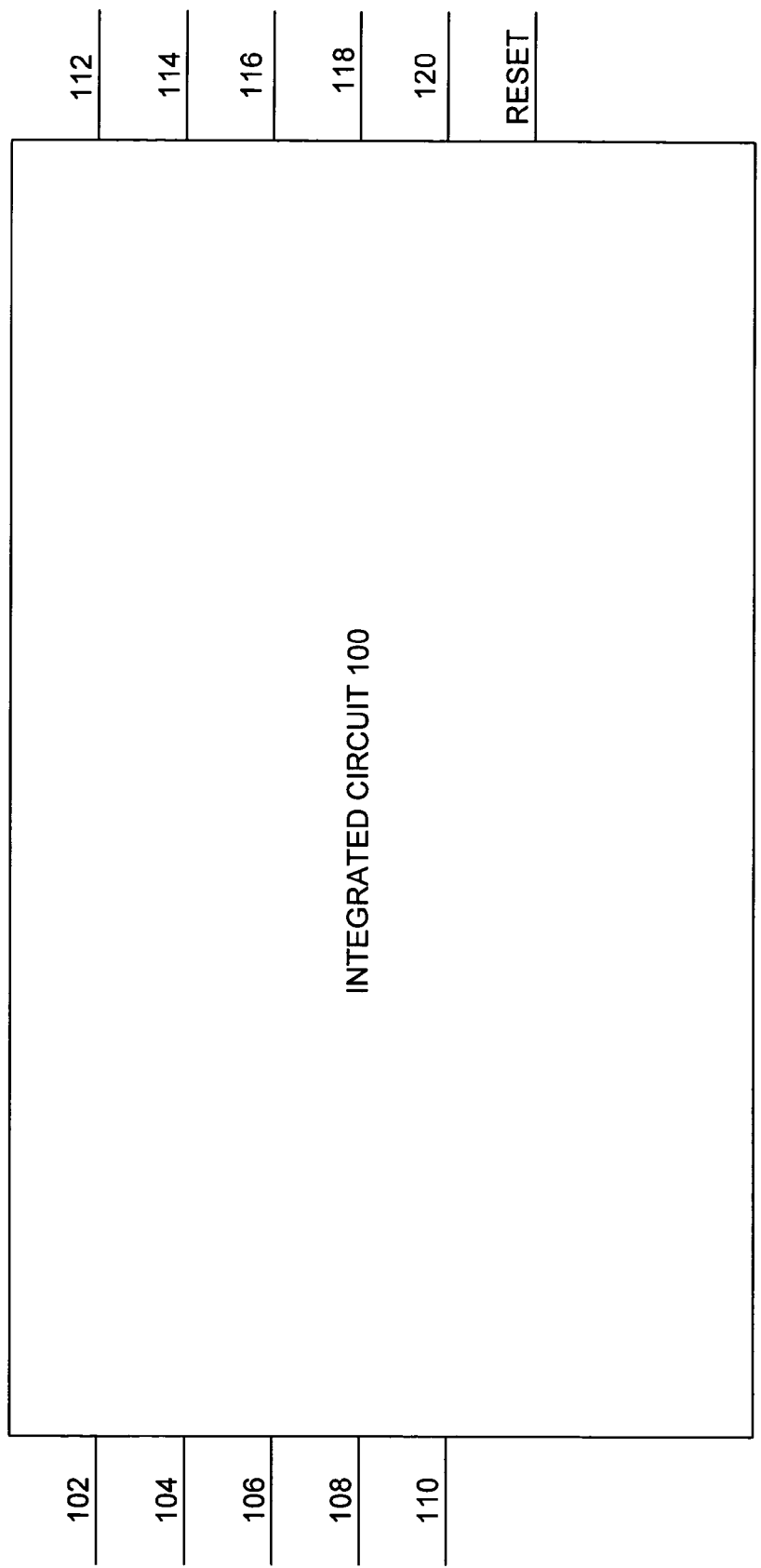
FIG. 1 is a block diagram of an exemplary integrated circuit having a number of pins and a designated reset pin according to the prior art.
Figure 2:
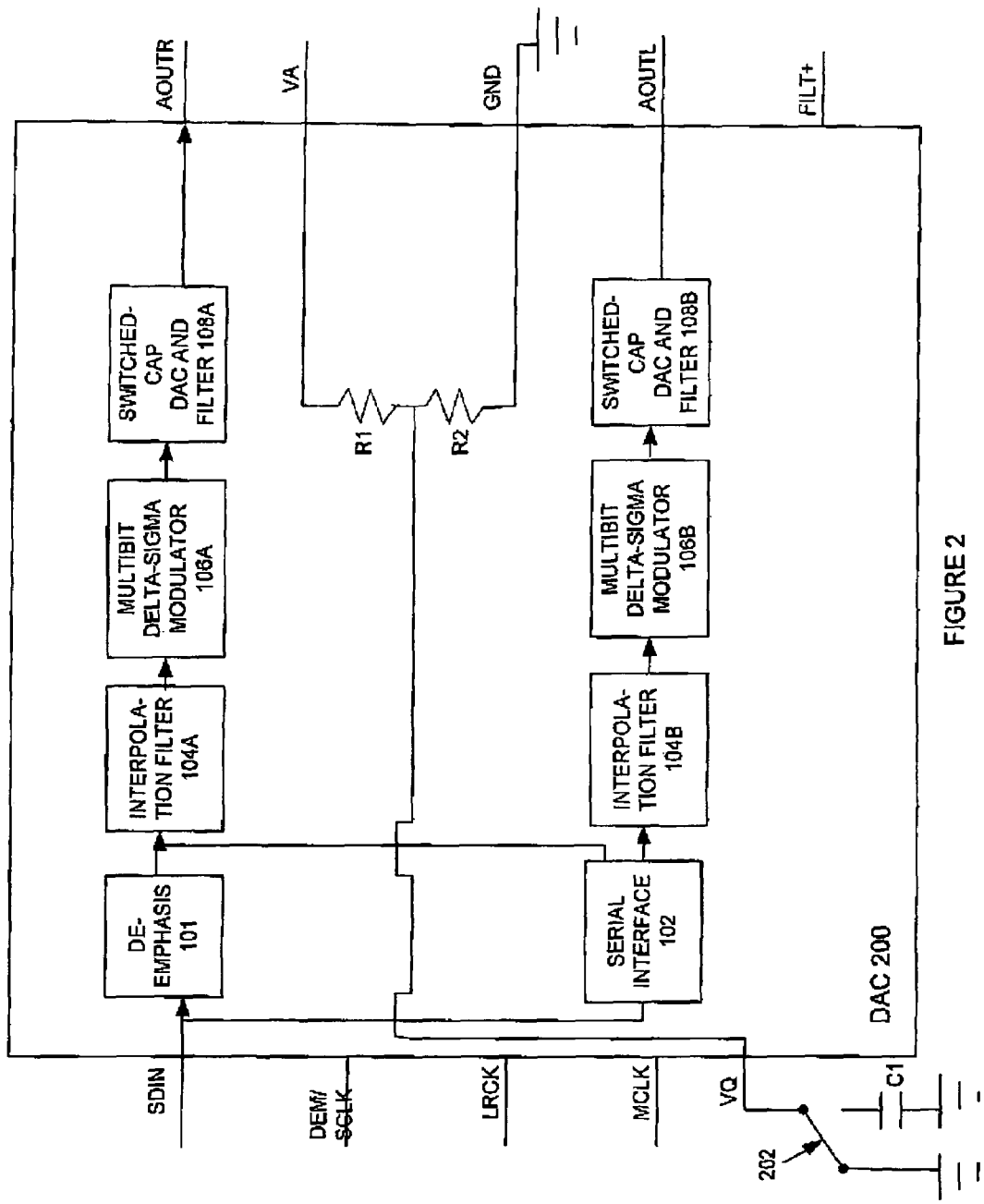
FIG. 2 is a block diagram of an exemplary embodiment of a digital-to-analog converter (DAC) utilizing an analog pin to indicate the DAC to reset according to the present invention.

With reference now to FIG. 2, an exemplary embodiment of a digital-to-analog converter (DAC) 200 utilizing an analog pin to indicate DAC 200 to reset is shown according to the present invention. DAC 200 has a number of pins, such as serial audio data input pin SDIN; de-emphasis/external serial clock input pin DEM/SCLK; left right clock pin LRCK; master clock pin MCLK; quiescent voltage pin VQ; positive voltage reference pin FILT+; left channel analog output pin AOUTL; ground pin GND; analog power pin VA; and right channel analog output pin AOUTR.

Pin SDIN is utilized for inputting two's complement serial audio data into DAC 200. Pin DEM/SCLK is utilized for either de-emphasis filter control or external serial clock input for DAC 200. Pin LRCK is utilized for determining whether the left or right channel is currently active on the serial audio data line. Pin MCLK is utilized to provide the clock source for the delta-sigma modulator and digital filters of DAC 200. Pin VQ is utilized to provide a filter connection for the internal quiescent voltage of DAC 200. Pin FILT+is utilized for the positive reference voltage for the internal sampling circuits. Pin AOUTL is utilized to provide the full-scale analog output level for the left channel of DAC 200. Pin GND is utilized for the ground reference. Pin VA is utilized to provide the positive power for the analog and digital sections of DAC 200. Pin AOUTR is utilized to provide the full-scale analog output level for the right channel of DAC 200.

DAC 200 further has a de-emphasis filter block 101 coupled to serial audio data input pin SDIN and a serial interface block 102 also coupled to serial audio data input pin SDIN. DAC 200 has two channels: a right channel and a left channel. The right channel comprises interpolation filter 104A, multibit delta-sigma modulator 106A, and a switched-capacitor digital-to-analog converter (DAC) unit and filter 108A coupled together in series as shown in FIG.

2. The right channel receives the right-channel digital signals from serial interface block 102. Interpolation filter 104A interpolates the right-channel digital signals, and multibit delta-sigma modulator 106A modulates the interpolated digital signals. Switched-capacitor DAC unit and filter 108A converts the modulated digital signals into analog signals and filters the analog signals for output through right channel analog output pin AOUTR.

The left channel comprises interpolation filter 104B, multibit delta-sigma modulator 106B, and a switched-capacitor digital-to-analog (DAC) converter unit and filter 108B coupled together in series as shown in FIG. 2. The left channel receives the left-channel digital signals from serial interface block 102. Interpolation filter 104B interpolates the left-channel digital signals, and multibit delta-sigma modulator 106B modulates the interpolated digital signals. Switched-capacitor DAC unit and filter 108B converts the modulated digital signals into analog signals and filters the analog signals for output through left channel analog output pin AOUTL.

In this embodiment of FIG. 2, the quiescent voltage pin VQ is the analog pin that is the non-dedicated reset pin utilized for indicating reset of DAC 200. A voltage divider having two resistors R1 and R2 in series is coupled within the DAC 200 between analog power pin VA and ground pin GND. Analog power pin VA connects to a positive power supply to operate the analog and digital sections of DAC 200. Ground pin GND connects to a ground. Quiescent voltage pin VQ is coupled to a node between the two resistors R1 and R2 of the voltage divider as shown in FIG. 2. Switch 202 switchingly couples quiescent voltage pin VQ to a capacitor C1 so that DAC 200 is indicated to operate in a normal operational mode. Capacitor C1, in turn, is coupled to ground. When pin VQ is coupled to capacitor C1, pin VQ is utilized to provide the filter connection for the internal quiescent voltage in the normal operational mode. In one example, the internal quiescent voltage may be half of a supply voltage. Switch 202 alternatively switches and couples quiescent voltage pin VQ directly to ground so that DAC 200 is indicated to reset. In this case, the voltage level applied at pin VQ is forced below the normal range for the internal quiescent voltage indicating that DAC 200 is to reset, and DAC 200 accordingly resets.

Figure 3:
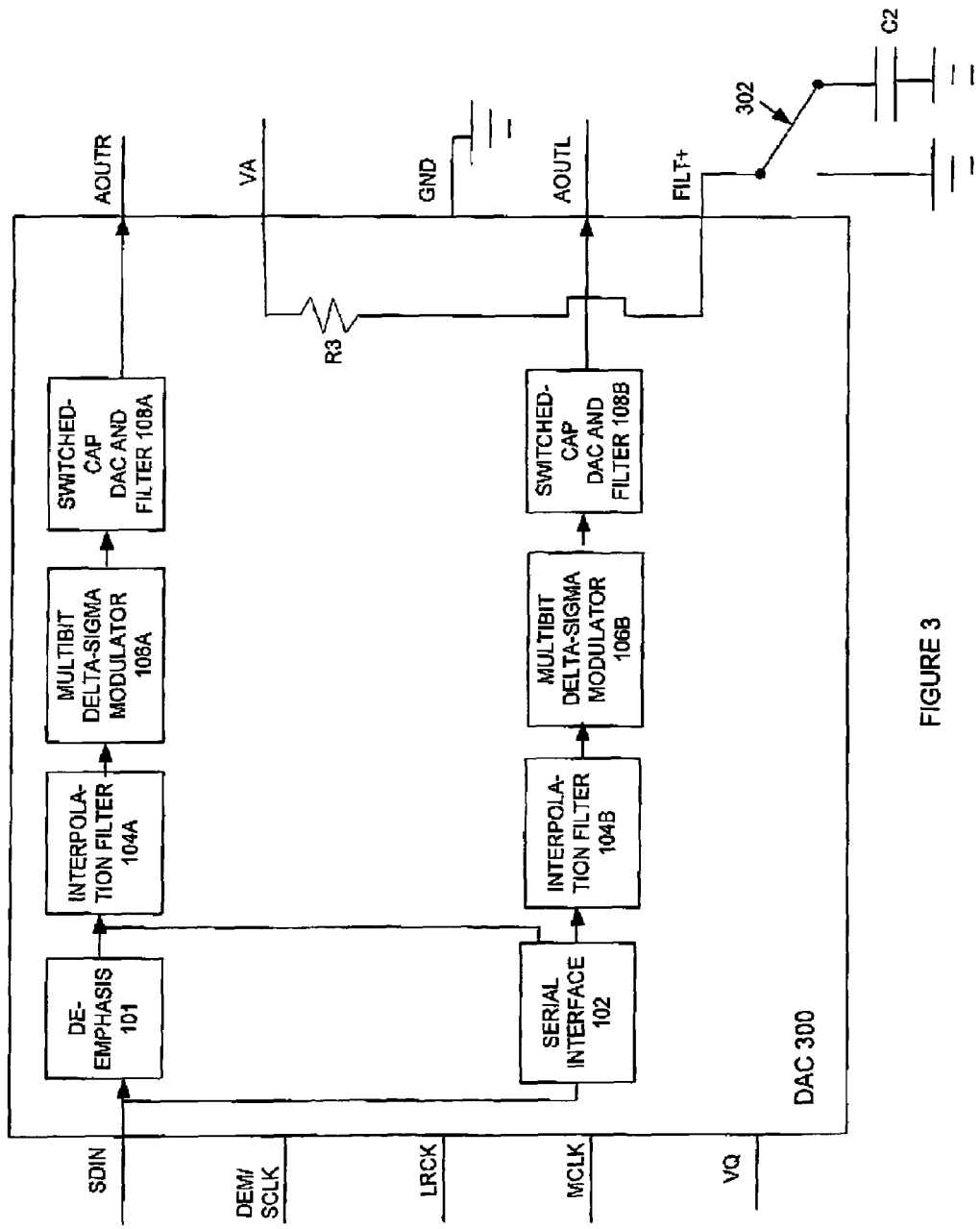
FIG. 3 is a block diagram of another exemplary embodiment of a digital-to-analog converter (DAC) utilizing another analog pin to indicate the DAC to reset according to the present invention.

Referring now to FIG. 3, another exemplary embodiment of a digital-to-analog converter (DAC) 300 utilizing another analog pin to indicate DAC 300 to reset is shown according to the present invention. DAC 300 is identical to DAC 200 except that the analog pin utilized for reset in this case is the positive voltage reference pin FILT+ instead of the quiescent voltage pin VQ as used by DAC 200. A resistor R3 is coupled within DAC 300 between analog power pin VA and positive voltage reference pin FILT+. Analog power pin VA connects to a positive power supply to operate the analog and digital sections of DAC 300.

Switch 302 switchingly couples positive voltage reference pin FILT+ to a capacitor C2 so that DAC 300 is indicated to operate in a normal operational mode. Capacitor C2, in turn, is coupled to ground. When pin FILT+ is coupled to capacitor C2, pin FILT+ is utilized to provide the positive reference voltage for the internal sampling circuits during the normal operational mode of DAC 300. Switch 302 alternatively switches and couples positive voltage reference pin FILT+ directly to ground so that DAC 300 is indicated to reset. In this case, the voltage level applied at pin FILT+ is forced below the normal range for the positive reference voltage indicating that DAC 300 is to reset, and DAC 300 accordingly resets.

Figure 4:
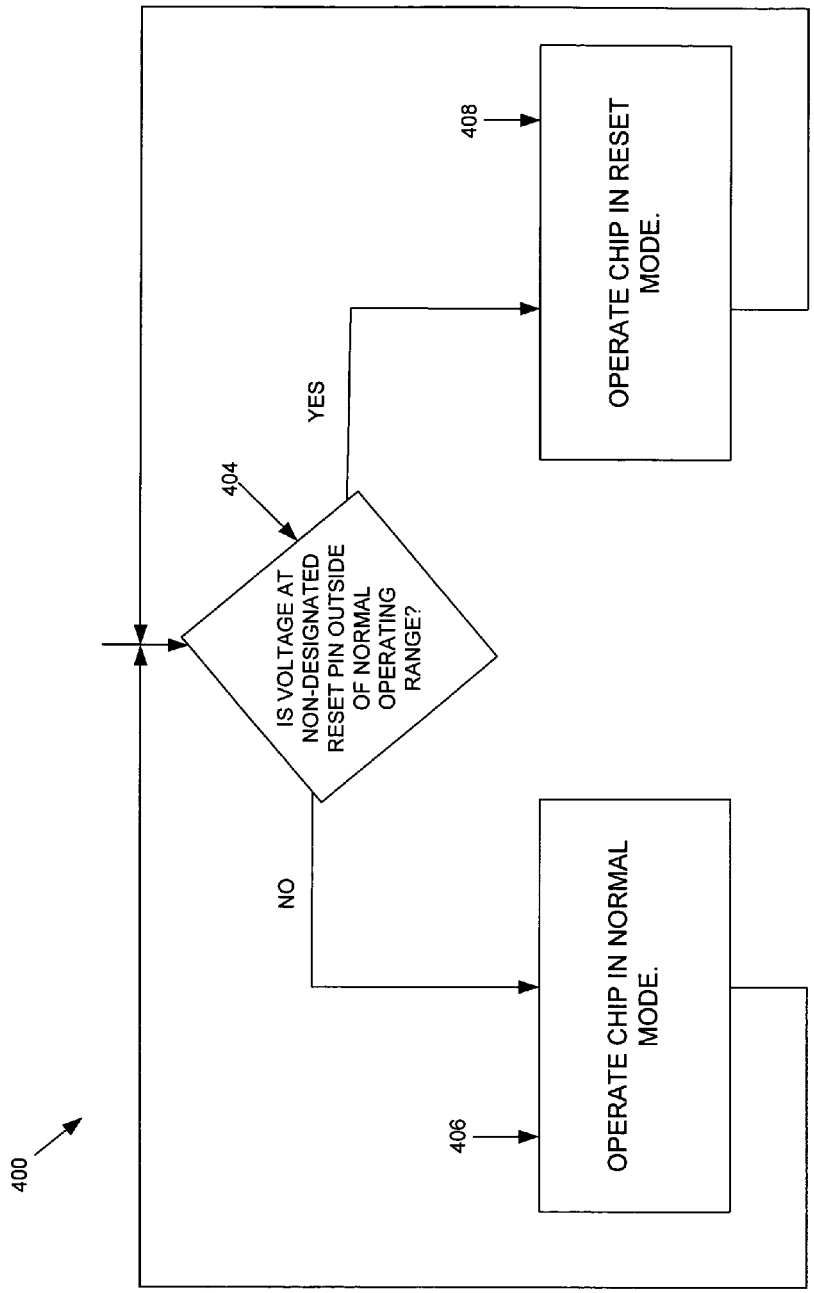
FIG. 4 is a flow chart diagram of an algorithm for using the non-designated reset pin to indicate whether a chip is to operate in the normal mode or in the reset mode.

With reference now to FIG. 4, a general algorithm 400 for using a non-designated reset pin to indicate whether a chip or integrated circuit is to operate in a normal mode and a reset mode is shown. A state machine may implement algorithm 400 for an integrated circuit or chip. Algorithm 400 includes a decision block 404. Decision block 404 shows a determination as to whether the voltage at the non-designated reset pin is outside of the normal operating range. If the voltage at the non-designated reset pin is not outside of the normal operating range, then algorithm 400 proceeds from decision block 404 to block 406. Block 406 depicts operating the chip in the normal mode. After block 406, algorithm 400 loops back before decision block 404 and continues to detect voltage levels at the non-designated reset pin. On the other hand, if the voltage at the non-designated reset pin is outside of the normal operating range at decision block 404, then algorithm 400 instead proceeds from decision block 404 to block 408. Block 408 illustrates operating the chip in the reset mode. After block 408, algorithm 400 then loops back before decision block 404 and continues to detect voltage levels at the non-designated reset pin. Thus, since the steps of algorithm 400 are continuously repeated, algorithm 400 is a continuous detection process for detecting whether the integrated circuit or chip is to operate in the normal mode or to be put into a reset mode.

Thus, the present invention provides a way for resetting an integrated circuit without the use of a dedicated reset pin. The present invention further resets an integrated circuit by using a non-dedicated reset pin and avoids using a power-on reset. The present invention also provides a way for resetting an integrated circuit without adding additional pins. The present invention overcomes the problems and disadvantages in accordance with the prior art.

While the invention has been particularly shown and described with reference to a preferred embodiment, it will be understood by those skilled in the art that various changes in form and detail may be made therein without departing from the spirit and scope of the invention.

What is claimed is:

1. A method for indicating reset of an integrated circuit, comprising:
    setting a pin signal for a non-dedicated reset pin, which is an analog, voltage reference pin, of the integrated circuit at a level outside of a normal range for the pin signal so that the integrated circuit is indicated to reset;
    coupling a resistor between an analog power pin that is coupled to an analog power supply and the analog, voltage reference pin within the integrated circuit;
    switchingly coupling the analog, voltage reference pin to a capacitor coupled to ground so that the integrated circuit is indicated to operate in a normal mode; and
    switchingly coupling the analog, voltage reference pin directly to ground so that the integrated circuit is indicated to reset.

2. The method according to claim 1, wherein setting a pin signal for a non-dedicated reset pin, which is an analog, voltage reference pin, of the integrated circuit at a level outside of a normal range for the pin signal so that the integrated circuit is indicated to reset further comprises:
    setting the pin signal below a level of the normal range for the pin signal.

3. The method according to claim 2, wherein setting the pin signal below a level of the normal range for the pin signal further comprises:
    switchingly coupling the non-dedicated reset pin directly to ground so that the pin signal is set below the level of the normal range for the pin signal and the integrated circuit is indicated to reset.

4. The method according to claim 3, further comprising: switchingly coupling the non-dedicated reset pin to a circuit element so that the pin signal is at a level within the normal range for the pin signal and the integrated circuit is indicated to instead operate in a normal mode.

5. The method according to claim 4, wherein the circuit element is a capacitor coupled between the non-dedicated reset pin and ground.

6. An integrated circuit, comprising:
circuitry for the integrated circuit; and
pins coupled to the circuitry wherein one of the pins is a non-dedicated reset pin, which is an analog, voltage reference pin, having a pin signal that is set at a level outside of a normal range for the pin signal so that the integrated circuit is indicated to reset;
a resistor coupled between an analog power pin that is coupled to an analog power supply and the analog, voltage reference pin;
the analog, voltage reference pin is switchingly coupled to a capacitor that is coupled to ground so that the integrated circuit is indicated to operate in a normal mode; and
the analog, voltage reference pin is switchingly coupled directly to ground so that the integrated circuit is indicated to reset.

7. The integrated circuit according to claim 6, wherein the pin signal being set outside of the normal range is set below a level of the normal range for the pin signal.

8. The integrated circuit according to claim 7, wherein the non-dedicated reset pin is switchingly coupled directly to ground so that the pin signal is set below the level of the normal range for the pin signal and the integrated circuit is indicated to reset.

9. The integrated circuit according to claim 8, wherein the non-dedicated reset pin is switchingly coupled to a circuit element so that the pin signal is at a level within the normal range for the pin signal and the integrated circuit is indicated to instead operate in a normal mode.

10. The integrated circuit according to claim 9, wherein the circuit element is a capacitor coupled between the non-dedicated reset pin and ground.

11. A digital-to-analog converter (DAC), comprising:
an interpolation filter for interpolating digital signals;
a delta-sigma modulator coupled to the interpolation filter wherein the delta-sigma modulator modulates the digital signals;
a digital-to-analog converter (DAC) unit with a number of DAC elements wherein the DAC unit is coupled to the delta-sigma modulator and the DAC unit converts the digital signals to analog signals;
an analog filter coupled to the DAC unit wherein the analog filter filters the analog signals; and
pins coupled to the digital-to-analog converter (DAC) wherein one of the pins is a non-dedicated reset pin, which is an analog, voltage reference pin, having a pin signal that is set at a level outside of a normal range for the pin signal so that the DAC is indicated to reset;
a resistor coupled within the DAC between an analog power pin that is coupled to an analog power supply and the analog, voltage reference pin;
the analog, voltage reference pin is switchingly coupled to a capacitor that is coupled to ground so that the DAC is indicated to operate in a normal mode; and the analog, voltage reference pin is switchingly coupled directly to ground so that the DAC is indicated to reset.

12. The DAC according to claim 11, wherein the pin signal being set outside of the normal range is set below a level of the normal range for the pin signal.

13. The DAC according to claim 12, wherein the non-dedicated reset pin is switchingly coupled directly to ground so that the pin signal is set below the level of the normal range for the pin signal and the DAC is indicated to reset.

14. The DAC according to claim 13, wherein the non-dedicated reset pin is switchingly coupled to a circuit element so that the pin signal is at a level within the normal range for the pin signal and the DAC is indicated to instead operate in a normal mode.

15. The DAC according to claim 14, wherein the circuit element is a capacitor coupled between the non-dedicated reset pin and ground.

16. A method for indicating reset of an integrated circuit, comprising:
setting a pin signal for a non-dedicated reset pin, which is an analog, quiescent voltage pin, of the integrated circuit at a level outside of a normal range for the pin signal so that the integrated circuit is indicated to reset;
coupling a voltage divider with two resistors in series between an analog power pin, that is coupled to an analog power supply, and a ground pin within the integrated circuit;
coupling the analog, quiescent voltage pin to a node between the two resistors of the voltage divider;
switchingly coupling the analog, quiescent voltage pin to a capacitor that is coupled to ground so that the integrated circuit is indicated to operate in a normal mode; and
switchingly coupling the analog, quiescent voltage pin directly to ground so that the integrated circuit is indicated to reset.

17. An integrated circuit, comprising:
circuitry for the integrated circuit; and
pins coupled to the circuitry wherein one of the pins is a non-dedicated reset pin, which is an analog, quiescent voltage pin, having a pin signal that is set at a level outside of a normal range for the pin signal so that the integrated circuit is indicated to reset;
a voltage divider with two resistors in series coupled within the integrated circuit between an analog power pin, which is connected to an analog power supply, and a ground pin;
the analog, quiescent voltage pin is coupled within the integrated circuit to a node between the two resistors of the voltage divider;
the analog, quiescent voltage pin is switching coupled to a capacitor that is coupled to ground so that the integrated circuit is indicated to operate in a normal mode; and
the analog, quiescent voltage pin is switchingly coupled directly to ground so that the integrated circuit is indicated to reset.

18. A digital-to-analog converter (DAC), comprising:
an interpolation filter for interpolating digital signals;
a delta-sigma modulator coupled to the interpolation filter wherein the delta-sigma modulator modulates the digital signals;
a digital-to-analog converter (DAC) unit with a number of DAC elements wherein the DAC unit is coupled to the delta-sigma modulator and the DAC unit converts the digital signals to analog signals;

an analog filter coupled to the DAC unit wherein the analog filter filters the analog signals;

pins coupled to the digital-to-analog converter (DAC) wherein one of the pins is a non-dedicated reset pin, which is an analog, quiescent voltage pin, having a pin signal that is set at a level outside of a normal range for the pin signal so that the DAC is indicated to reset;

a voltage divider with two resistors in series coupled within the DAC between an analog power pin, which is connected to an analog power supply and a ground pin;

the analog, quiescent voltage pin is coupled to a node between the two resistors of the voltage divider;

the analog, quiescent voltage pin is switchingly coupled to a capacitor that is coupled to ground so that the DAC is indicated to operate in a normal mode; and the analog quiescent voltage pin is switchingly coupled directly to ground so that the DAC is indicated to reset.

* * * * *